(12) United States Patent
Betz et al.

(10) Patent No.: US 8,395,393 B2
(45) Date of Patent: Mar. 12, 2013

(54) CABLE TEST METHOD

(75) Inventors: James R. Betz, Tucson, AZ (US);
Michael D. Ambrose, Vail, AZ (US);
Brett A. Anderson, Tucson, AZ (US);
Bryan J. Wallace, Oro Valley, AZ (US);
Edward G. Robinson, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 396 days.

(21) Appl. No.: 12/698,461

(22) Filed: Feb. 2, 2010

(65) Prior Publication Data

US 2011/0187385 A1  Aug. 4, 2011

(51) Int. Cl.
*G01R 31/02* (2006.01)
(52) U.S. Cl. ........................... 324/539; 324/542
(58) Field of Classification Search .................. 324/539, 324/542; 370/242
See application file for complete search history.

(56) References Cited

U.S. PATENT DOCUMENTS

| | | | |
|---|---|---|---|
| 3,678,379 A | | 7/1972 | Arvay et al. |
| 4,471,293 A | * | 9/1984 | Schnack ........................ 324/540 |
| 5,027,074 A | | 6/1991 | Haferstat |
| 5,436,554 A | | 7/1995 | Decker, Jr. |
| 5,570,029 A | * | 10/1996 | Bottman et al. ............... 324/628 |
| 7,116,112 B1 | | 10/2006 | Shu |
| 2004/0066202 A1 | * | 4/2004 | Pereira et al. ................. 324/539 |
| 2008/0316930 A1 | * | 12/2008 | Xu et al. ....................... 370/242 |

FOREIGN PATENT DOCUMENTS

WO      97/22013 A1     6/1997

OTHER PUBLICATIONS

Ahonen, M. F., "Microprocessor Controlled Cable Tester", IBM Technical Disclosure Bulletin, Aug. 1980, vol. 23, No. 3, pp. 972-975.
International Search Report and Written Opinion from corresponding International Application No. PCT/US10/56462.
"Multi-Network Cable Testers", BK Precision catalog, p. 77, undated (but admitted prior art).

* cited by examiner

*Primary Examiner* — Vincent Q Nguyen
(74) *Attorney, Agent, or Firm* — Renner, Otto, Boisselle & Sklar, LLP

(57) ABSTRACT

A cable testing method includes a tester that includes at least one connector electrically coupled, such as by conductive traces, to a computer. Both ends of the cable are connected to the at least one connector. The computer then sends a signal to one of the conductive traces of the conductor, at one of the ends of the cable, while at the same time monitoring for a signal at the other contacts of the conductor that are in contact with conductive traces of the cable. The process of sending power while monitoring may then be repeated for other of the conductive traces of the cable, for example until substantially all of the conductive traces of the cable are tested. The process of testing multiple of the conductive traces sequentially may be performed automatically by the computer, allowing performance of the cable to be tested quickly, completely, and accurately.

9 Claims, 4 Drawing Sheets

CABLE TEST METHOD

GOVERNMENT RIGHT STATEMENT

This invention was made with the United States Government support under Contract Number N00024-03-C-6111 awarded by the Department of the Navy. The United States Government has certain rights to this invention.

BACKGROUND OF THE INVENTION

1. Technical Field of the Invention

The invention is in the general field of systems and methods for testing electrical cables.

2. Description of the Related Art

Cables frequently wear out and are a source of lost time when troubleshooting a system. Many times it is found that the problem with a system is a faulty cable. New cables need to be tested to verify the integrity of the cable and assure the end user of proper operation. Cable test methods exist, but it would be advantageous to have improvements in such test methods.

SUMMARY OF THE INVENTION

One area of potential improvement in cable test methods stems from a need to test a cable's pin-to-pin connections for continuity and isolation. It would be advantageous for such test methods to be fast, to allow testing to be performed quickly and accurately. It would also be advantageous for the testing to be adaptable so that multiple types of cables can be tested and individual tests can be changed quickly to take design changes into account (such as changes in the pin to pin connections of the cable).

According to an aspect of the invention, a cable testing system and method includes a boundary scan device connected to ends of a cable.

According to another aspect of the invention, a cable testing system and method include connecting a cable to be tested to a tester, and applying a signal to an end of one of the conductors of the cables, while checking for a signal at the other conductor ends of the cable.

According to yet another aspect of the invention, a method of testing a cable includes the steps of: providing at least one connector having multiple connector electrical contacts, and a computer electrically coupled to the connector electrical contacts; electrically coupling ends of cable electrical conductors of the cable to respective of the connector electrical contacts; sending a signal from the computer to one of the connector electrical contacts, which is in contact with one of the cable electrical conductors; and at the same time as the sending, monitoring, using the computer, at least multiple other of the connector electrical contacts.

According to still another aspect of the invention, a method of testing a cable includes the steps of: providing a tester having more than two connectors each having multiple connector electrical contacts, and a computer electrically coupled to the connector electrical contacts, wherein the connectors have different numbers of connector electrical contacts, and wherein the tester is a boundary scan compliant device; coupling ends of a cable to respective of the connectors, such that ends of cable conductors of the cable are electrically coupled to connector electrical contacts; sending a signal from the computer to one of the connector electrical contacts, which is in contact with one of the cable electrical conductors; at the same time as the sending, monitoring, using the computer, at least multiple other of the connector electrical contacts; and repeating the sending and the monitoring for substantially all of the cable electrical conductors.

According to yet another aspect of the invention, a cable test configuration includes: a computer; a boundary scan compliant cable tester operatively coupled to the computer; and a cable. Ends of the cable are coupled to one or more connectors of the tester.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various aspects of the invention.

DETAILED DESCRIPTION

A cable testing method includes a tester that includes at least one connector electrically coupled, such as by conductive traces, to a computer. Both ends of the cable are connected to the at least one connector. The computer then sends power (a signal) to one of the conductive traces of the conductor, at one of the ends of the cable, while at the same time monitoring for a signal at the other contacts of the conductor that are in contact with conductive traces of the cable. The process of sending power while monitoring may then be repeated for other of the conductive traces of the cable, for example until substantially all of the conductive traces of the cable are tested. The process of testing multiple of the conductive traces sequentially may be performed automatically by the computer, allowing performance of the cable to be tested quickly, completely, and accurately.

Figure 1:
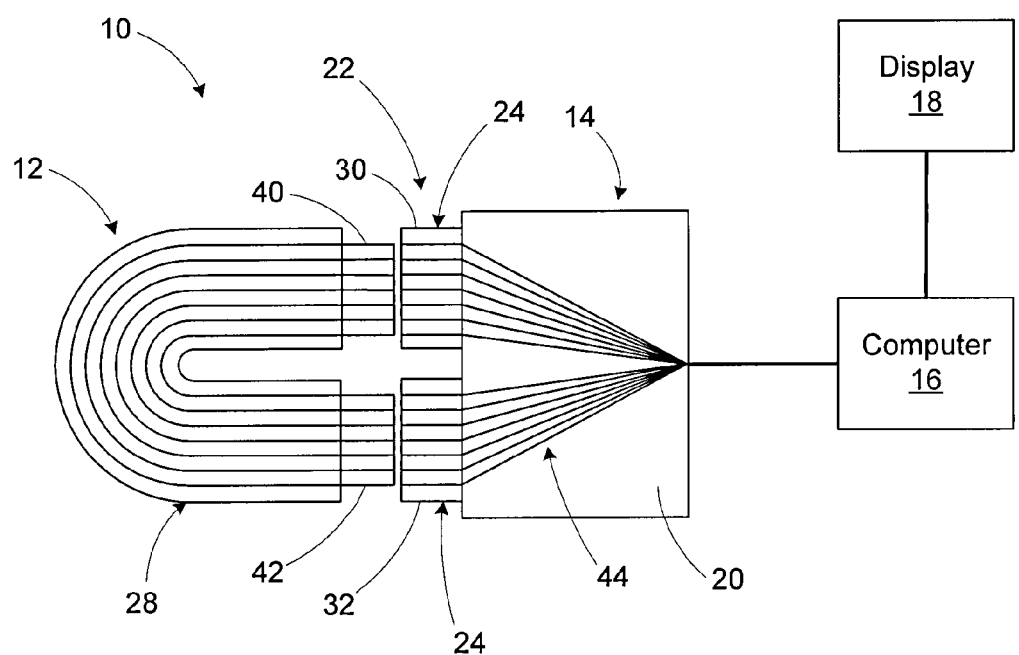
FIG. 1 is a schematic diagram of cable testing configuration in accordance with an embodiment of the invention.

FIG. 1 shows a cable testing configuration 10 in which a cable 12 is tested using a tester 14 and a computer 16. The computer 16 may be coupled to a display or monitor 18. The tester 14 may be a boundary scan compliant device, although it is not used to perform conventional boundary scan functions, such as checking identification of components, in-circuit programming, or checking proper placement of components on a board. Further details regarding boundary scan architecture and testing can be found in the Standard Test Access Port and Boundary-Scan Architecture Specification, IEEE Standard 1149.1, which is incorporated herein by reference. Boundary scan architecture and testing procedures are also referred to as "JTAG," after the Joint Test Action Group, which originally developed the standards. A device that operates in compliance with these standards may be referred to herein as a "boundary scan device" or a "boundary scan compliant device." The tester 14 may be a board 20 having one or more electrical connectors 22 thereupon, each of the one or more connectors 22 having electrical contacts 24 for making electrical contact with conductive traces (cable electrical conductors) 28 of the cable 12. The board 20 may be a printed circuit board. The connectors 22 may include a first connector 30 and a second connector 32, with a first cable end 40 of the cable 12 coupled to the first connector 30, and a second cable end 42 of the cable 12 coupled to the second connector 32. At the connectors 22 the cable electrical conductors 28 are coupled to the connector electrical contacts 24.

Board conductive traces 44 provide electrical connection between the connector electrical contacts 24, and the computer 16. The connection between the board 20 and the computer 16 may be by any of a variety of suitable interfaces. For example, the board 20 may be a circuit board that is inserted into an appropriate slot in the computer 16. Alternatively the board conductive traces 44 may be coupled to the computer 16 by any of a variety of suitable connectors and/or cables.

The computer 16 can sequentially send signals (power) to individual of the electrical contacts 24 of the connectors 22, while monitoring other of the electrical contacts 24 for a possible response. This test can be used to determine whether a particular cable electrical conductor 28 is correctly connected corresponding to a desired configuration of the cable 12. If the particular cable electrical conductor 28 is correctly configured, then applying a signal (power) to a connector electrical contact 24 hooked to one end of the cable electrical conductor 24 will produce a signal at a desired connector electrical conductor 24 at the other end of the cable 12. In addition, applying the power to one end of the cable electrical conductor 28 should not produce any additional undesired signals at other (undesired) cable electrical contacts 24. One type of problem that can occur is when a signal does not result at the electrical contact 24 corresponding to the desired connection for the cable electrical conductor 28. Another possible problem is when additional signal(s) are received at electrical contacts 24 other than desired. The results of such a test can be characterized as a successful test (pass) for the subject cable electrical conductor 28, or a failed test either because of an open result (failure for a signal to be received at a desired connector electrical contact 24) and/or a short circuit (a signal received at an undesired connector electrical contact 24 at any of the connectors 22).

The testing described may be repeated sequentially for additional of the connector electrical contacts 24, with a signal (power) applied sequentially to different connector electrical contacts 24, while monitoring for a response at the remaining connector electrical contacts 24 that are in contact with cable electrical conductors 28 of the cable 12. This allows testing of the cable electrical conductors 28, to assure that proper (desired) connections are made by the cable 12, with no open connections and no short circuits. The testing may be performed for substantially all of the cable electrical conductors 28, fully testing the connections made by substantially all of the cable electrical conductors 28. This may be done to verify the configuration of the cable 12 prior to use.

The computer 16 may control the sequencing of the test, controlling the application of power from one connector electrical contact 24 to the next, and the gathering of the results. More broadly, the testing may be controlled by a controller, which may be the computer 16, or alternatively may be a circuit or other device that is part of the tester 14. Control of the tester 14 may be embodied in any of a variety of ways, for example being in software, hardware and/or firmware. The tester 14 may be controlled by software installed on and run on the computer 16. For instance the software may be any of a variety of programs for controlling and operating boundary scan capable devices. One suitable program is VIP Manager, available from JTAG Technologies.

The test results may be displayed on the screen or monitor 18, in any of a variety of suitable formats. The results may merely indicate whether the cable 12 passed all of its tests, or may alternatively provide results showing the test results for individual of the conductors 28 of the cable 12. It will be appreciated that there are a wide variety of suitable ways of conveying and/or storing results of cable testing. Although the monitor is shown in FIG. 1 as coupled to the computer 16, alternatively the monitor 18 could be coupled to or a part of the tester 14.

Figure 2:
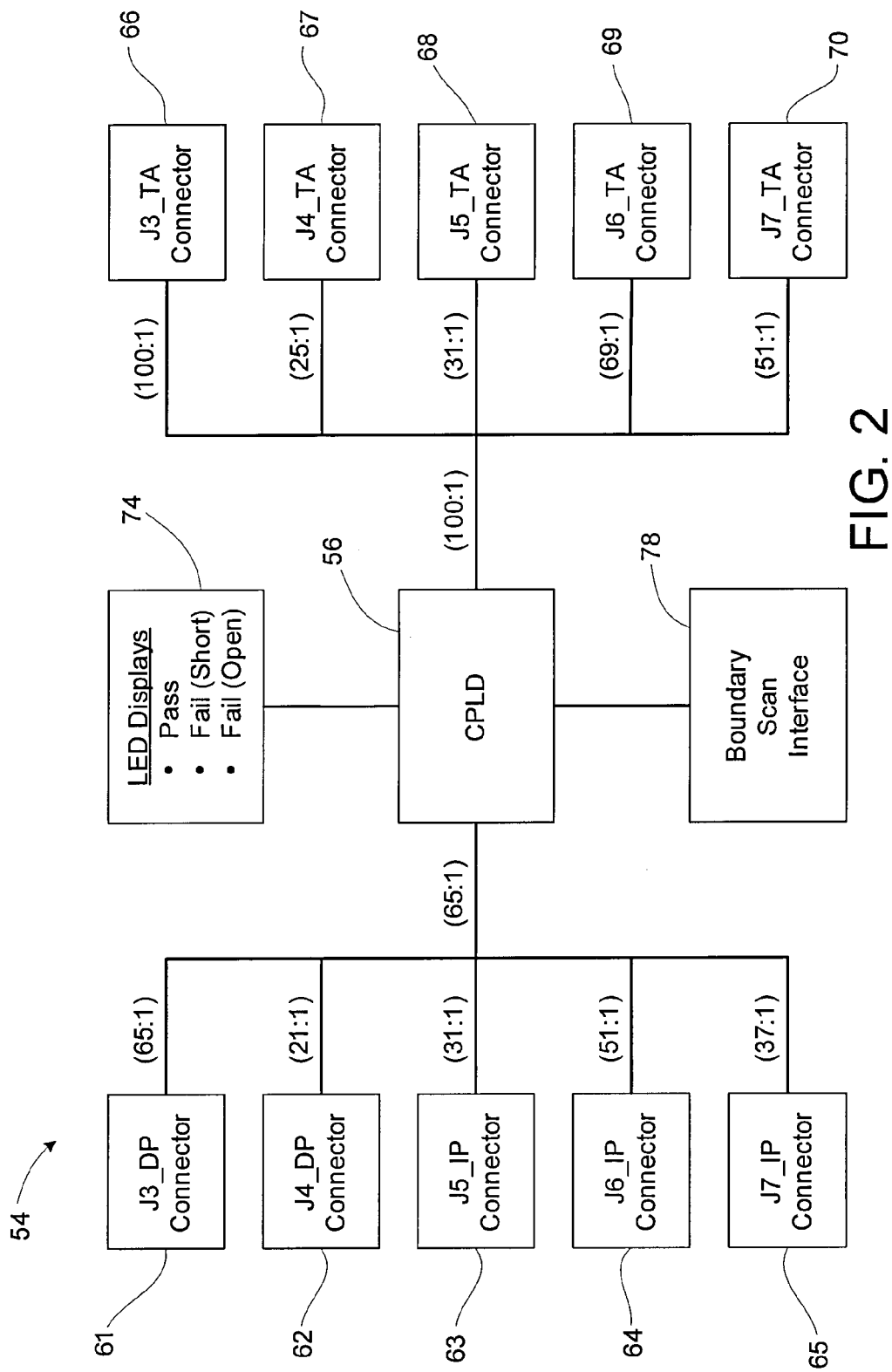
FIG. 2 is a schematic diagram of another embodiment tester, usable in a cable testing configuration such as the cable testing configuration shown in FIG. 1.

FIG. 2 shows a more complex type of tester, a tester 54. The tester 54 includes a complex programmable logic device (CPLD) 56 that is connected to several connectors 61-70. The connectors 61, 62, 63, 64, and 65 are connected in parallel to one set of inputs of the CPLD 56. The connectors 66, 67, 68, 69, and 70 are connected in parallel to one set of inputs of the CPLD 56. This enables one end of the cable 12 (FIG. 1) to be plugged into one of the connectors 61-65, and the other end of the cable 12 to be plugged into one of the connectors 66-70. The connectors 61-70 may have different configurations of male or female contacts, for example having different numbers of contacts, different special configurations of the contacts, and/or different types of contacts (for example male or female contacts). For example, the connectors 61-65 may have 65, 21, 31, 51, and 37 contacts, respectively. The connectors 66-70 may have 100, 25, 31, 69, and 51 contacts, respectively. By providing a variety of different types of connectors, it will be appreciated that the tester 54 is able to accommodate a variety of different types of cable ends, which may have any of a wide variety of different connectors on their ends. It is important that the connectors 61-70 include a connector with enough electrical contacts (pins or electrical receptacles) to accommodate the greatest number of conductors expected at the ends of the cable 12.

The CPLD 56 is coupled to a light emitting diode (LED) display 74 that displays results of testing. The LED display 74 may include multiple lights (LEDs) that are activated by certain test results. For example the display 74 may include a green light that lights up if the cable 12 (FIG. 1) passes its test, and one or more red lights that light up if the cable 12 fails testing, with one red light being illuminated if the test fails because a short circuit, and another red light being illuminated if the test fails because of an open (unconnected) cable conductor.

The tester 54 also includes a boundary scan interface 78 for interfacing with the computer 16 (FIG. 1). The boundary scan interface 78 may be a boundary scan compliant interface, capable of sending and receiving signals to and from the computer 16, and allowing control by the computer 16.

In an implementation of the tester 54 a single CPLD 56 with 168 input/output (I/O) pins was placed on a printed wiring board (printed circuit board) with the mating connectors for five different types of cables. Three of the I/O pins were used to drive LEDs, and the remaining 165 pins were used to test cables. Boundary scan tools of a computer coupled to the tester 54 use a net list from the test board to create boundary scan tests. Without a cable attached, the tests check that the computer can communicate with the CPLD, verifies the part identification number (ID) of the CPLD, and verifies that all of the pins on the CPLD are open. Checking that all pins are open is useful for making sure that board has been assembled correctly, and is working properly.

The user can input an ASCII file or a file of another type to provide the tester 54 with information on the desired connections for a cable 12 (FIG. 1) to be attached to the tester 54. The information on desired connections may be input into a computer (such as the computer 16 (FIG. 1)), using any of a variety of input devices, for example a keyboard or any of a variety of computer-readable media. The file may be merged with other boundary scan information to create a boundary scan net list file. Thus in a boundary scan cable test method, a net list for a test device is merged with a separate file to describe the required connections. If a cable under test is faulty, the boundary scan interconnect test will detect the failure because the device is not shorted to itself in the way that that is described in the file with the required cable connections.

FIGS. 1 and 2 show only two examples of a configuration of a tester for testing cables or other devices. It will be appreciated that different features of the tester 14 and the tester 54 may be combinable in a single device. It will also be appreciated that many other alternative configurations for a tester are possible. For example the tester 14/54 may include any of a variety of boundary-scan-compatible devices, such as CPLDs or field-programmable gate arrays (FPGA), or other types of integrated circuits, such as processors. If desired, a tester could be configured so that it could test many different cables (even different types of cables) in a single process by connecting the mating connectors for the different cables in parallel. A functional board (tester) could test the cable in a boundary scan mode either directly or by incorporating a switching scheme. The implementations of the basic idea of using a boundary scan device are numerous and varied.

Figure 3:
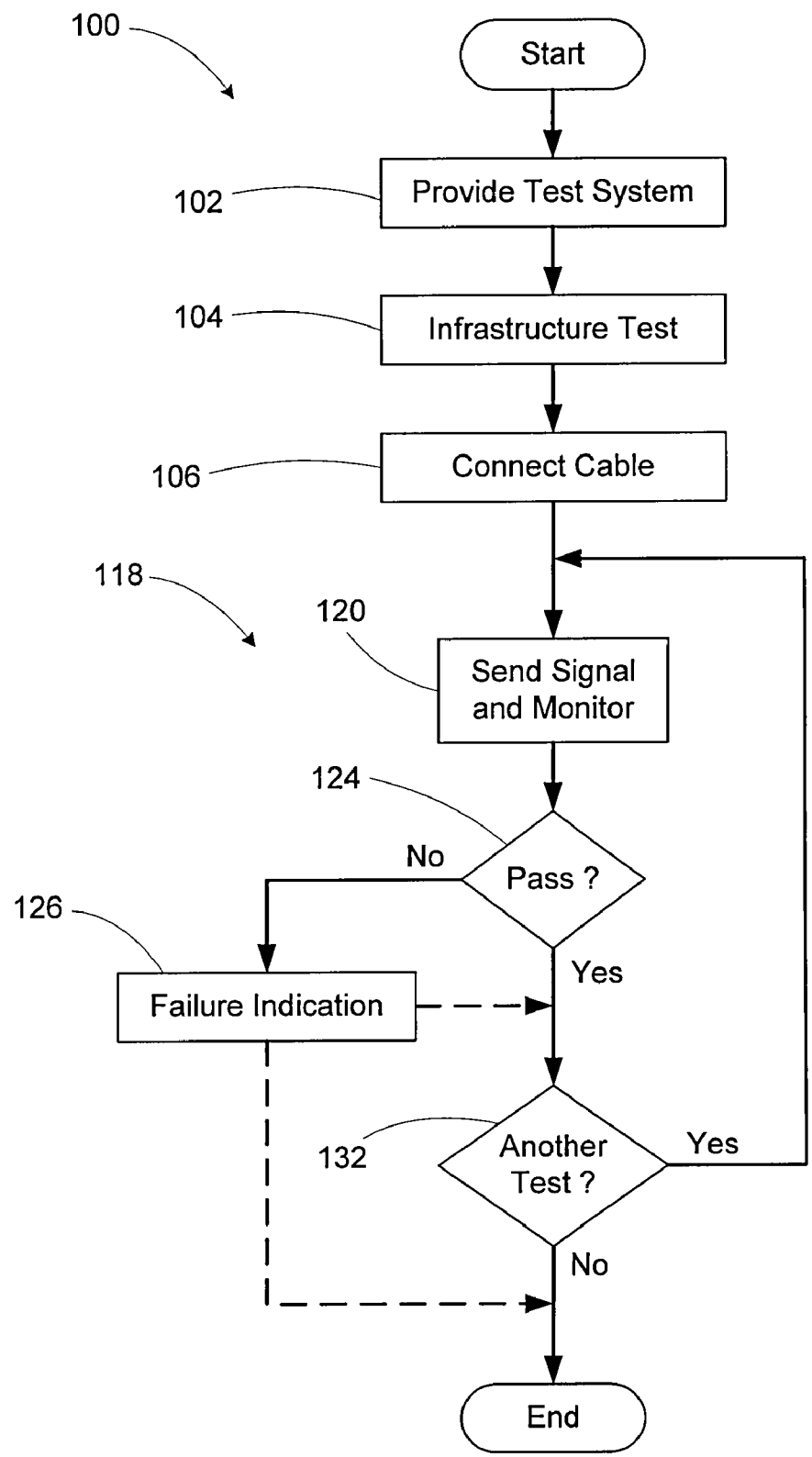
FIG. 3 is a high level flow chart of certain method steps in a cable testing method in accordance with an embodiment of the present invention.
Figure 4:
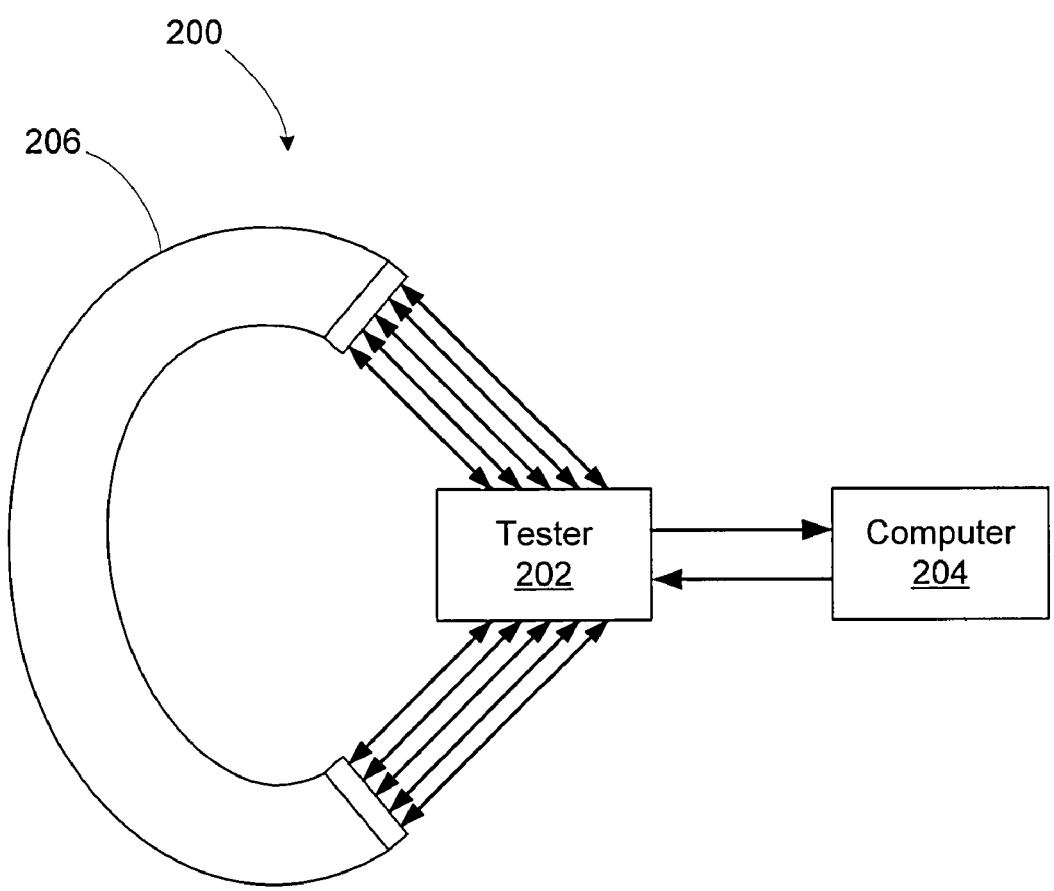
FIG. 4 is a schematic diagram of still another embodiment of a cable testing configuration in accordance with the present invention.

FIG. 3 shows steps in a method 100 of testing a cable, with the test setup shown schematically in FIG. 4. In step 102 the test system 200 is provided. The system 200 is shown as consisting of a tester 202 coupled to a computer 204. In the description below the steps of the method 100 are described in terms of the system 200, although it will be appreciated that the system 200 may include components or features shown in FIGS. 1 and 2, and discussed above.

Before the connection of a cable 206 to the tester 202, an infrastructure test is performed in step 104. The infrastructure test 104 includes a capture test checks to make sure that information enters and exits the tester 202 correctly. The infrastructure test 104 also includes an identification test to test the identification of parts of the tester 202, such as the identity of the CPLD 56 (FIG. 2).

The cable 12 (FIG. 1) is connected to the test fixture in step 106. The connection may involve interfacing mating parts on the cable 12 and the board 20 (FIG. 1) of the tester 14 (FIG. 1). The connection may involve plugging in a connector into a corresponding receptacle. It will be appreciated that the cable 12 or the board 20 may constitute a male or female connector end, for mating together cable ends with the board 20.

The testing of the cable 12 is performed in an interconnect testing procedure 118. In step 120 power is provided to one of the connector electrical contacts of the tester 202, while monitoring the remaining connector electrical contacts for a signal. If a failed test is detected (either an open result or a short circuit) at step 124, then a failed test indication is provided to the user at step 126. The test failure indication may be illumination of a light or any of a wide variety of other indicators provided to a user, such as by any of a variety of visual and/or aural signals. The indication may be provided in real time, as the detection is made. Alternatively or in addition the test failure indication may be signaled to the user at a later time, for instance after all of the testing has been completed.

If the monitoring detects a signal at the desired location (corresponding to the desired configuration of the cable 206), then a decision point is reached in step 132 as to whether more connections are to be testing. If so the method 100 proceeds to step 120 for providing power to a different of the contacts, while monitoring the remaining contacts for signals. This may be done sequentially for all or substantially all of the electrical contacts that are coupled to the cable 206. If the testing is completed that method 100 reaches it end. A visual, aural, and/or other suitable signal of the end of testing may be given to the end user.

Detection of a failed test may cause testing to cease immediately. Alternatively testing may proceed for the rest of the electrical contacts that are coupled to the cable 206.

It will be appreciated that the method 100 may be used to test cables for intermittent failure. The method 100 may run in a continuous loop while flexing or otherwise manipulating the cable, in an attempt to find possible intermittent failure conditions.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of testing a cable, the method comprising:

providing a first tester connector and a second tester connector each having two interfacing sides, and each having multiple connector electrical contacts, and a computer electrically coupled to one side of the first tester connector and one side of the second tester connector, via the connector electrical contacts;

electrically coupling cable conductor ends of cable electrical conductors of the cable to respective of the other sides of the first and second tester connectors, via the connector electrical contacts;

sending a signal from the computer to one of the connector electrical contacts, which is in contact with one of the cable electrical conductors; and at the same time as the sending, monitoring, using the computer, at least multiple other of the connector electrical contacts;

wherein the sending and the monitoring are accomplished through a tester that includes the tester connectors, and that is operatively coupled to both the computer and the cable conductor ends of the cable;

wherein the electrically coupling includes coupling a first cable end of the cable to the first tester connector, and coupling a second cable end of the cable that is on an opposite side of the cable from the first cable end, to the tester second connector;

wherein the first tester connector and the second tester connector are parts of a device that includes more than two connectors, including the first tester connector and the second tester connector, the connectors having different numbers number of contacts; and wherein the coupling includes coupling the cable ends to the connectors of the tester that have a corresponding number of contacts.

2. The method of claim 1, wherein the sending and the monitoring are repeated sequentially for other of the connector electrical contacts.

3. The method of claim 1, wherein the sending and the monitoring are accomplished through a boundary scan compliant device that includes the at least one connector and that is operatively coupled to both the computer and ends of the cable.

4. The method of claim 1, wherein the sending and the monitoring are repeated for substantially all of the connector electrical contacts that are in contact with cable electrical conductors.

5. The method of claim 1, further comprising communicating the result of the testing.

6. The method of claim 5, wherein the communicating includes illuminating one of a series of lights to indicate the result of the testing.

7. The method of claim 6, wherein the lights include a light that indicates passage of the testing, and at least two lights that indicate different types of failure of the testing.

8. The method of claim 5, wherein the communicating includes at least one type of communication that indicates passage of the testing, and at least two types of communication that indicate different types of failure of the testing.

9. The method of claim 8, wherein the at least two types of communication include a first communication that corresponds to a short circuit, and a second communication that corresponds to an open connection.

* * * * *